United States Patent
Yan et al.

(10) Patent No.: US 8,845,866 B2
(45) Date of Patent: Sep. 30, 2014

(54) OPTOELECTRONIC DEVICES HAVING ELECTRODE FILMS AND METHODS AND SYSTEM FOR MANUFACTURING THE SAME

(75) Inventors: Min Yan, Ballston Lake, NY (US); Ahmet Gun Erlat, Clifton Park, NY (US); Jie Liu, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1469 days.

(21) Appl. No.: 11/316,267

(22) Filed: Dec. 22, 2005

(65) Prior Publication Data
US 2007/0159065 A1 Jul. 12, 2007

(51) Int. Cl.
| | | |
|---|---|---|
| C23C 14/00 | (2006.01) | |
| C23C 14/32 | (2006.01) | |
| C23C 14/35 | (2006.01) | |
| C23C 14/04 | (2006.01) | |
| C23C 14/08 | (2006.01) | |

(52) U.S. Cl.
CPC ............... *C23C 14/044* (2013.01); *C23C 14/35* (2013.01); *C23C 14/086* (2013.01)
USPC ........................ 204/192.1; 438/584

(58) Field of Classification Search
USPC .......... 427/282, 569–579; 428/212, 217, 218, 428/220; 204/192.1, 298.01
See application file for complete search history.

(56) References Cited

U.S. PATENT DOCUMENTS

| | | | | |
|---|---|---|---|---|
| 4,288,307 A | | 9/1981 | Wasa et al. ................ | 204/192 D |
| 5,399,502 A | * | 3/1995 | Friend et al. ................ | 438/22 |
| 5,427,671 A | * | 6/1995 | Ahmed ................... | 204/298.23 |
| 5,685,942 A | * | 11/1997 | Ishii ......................... | 156/345.48 |
| 5,885,425 A | * | 3/1999 | Hsieh et al. ............... | 204/192.12 |
| 5,922,176 A | | 7/1999 | Caskey | |
| 6,063,436 A | * | 5/2000 | Pavell et al. .................. | 427/162 |
| 6,136,444 A | * | 10/2000 | Kon et al. .................. | 428/423.1 |
| 6,344,608 B2 | * | 2/2002 | Kariya et al. ................. | 136/257 |
| 6,383,345 B1 | | 5/2002 | Kim et al. ................ | 204/192.11 |
| 6,458,253 B2 | * | 10/2002 | Ando et al. ............... | 204/192.15 |
| 6,497,799 B1 | * | 12/2002 | McLeod ................... | 204/192.2 |
| 6,821,655 B1 | | 11/2004 | Ohta et al. .................... | 428/701 |
| 6,849,165 B2 | | 2/2005 | Klöppel et al. .......... | 204/192.15 |

(Continued)

FOREIGN PATENT DOCUMENTS

| | | | |
|---|---|---|---|
| EP | 0 928 977 | 7/1999 | |
| JP | 07 310181 | 11/1995 | |
| JP | 2001 123268 | 5/2001 | |
| WO | WO 2004/040044 A2 | 5/2005 | ............. C01G 39/00 |

OTHER PUBLICATIONS

Hoshi Y et al.; Preparation of ITO Thin Films at Low Temperature by Opposed Target-Type Reactive Sputtering Electronics & Communications in Japan, Part II—Electronics, Wiley, Hoboken, NJ, US, vol. 73, No. 2, Feb. 1990 (Feb. 1, 1990), pp. 53-59, XP000140247.

C.G. Granqvist, A. Hultåker ;"Transparent and conducting ITO films: new developments and Applications"; 2002 Elsevier Science B.V.; Thin Solid Films 411 (2002) 1-5.

Y.-H. Tak et al.: "Criteria for ITO (indium-tin-oxide) thin film as the bottom electrode of an organic light emitting diode"; 2002 Elsevier Science B.V.; Thin Solid Films 411 (2002) 12-16.

(Continued)

*Primary Examiner* — Donald Raleigh
(74) *Attorney, Agent, or Firm* — Jason K. Klindtworth

(57) ABSTRACT

A method and system for DC magnetron sputtering deposition of films on plastic substrates. The method includes using a shield to block deposition in a spatial region corresponding to a plasma region formed during magnetron sputtering. An optoelectronic device including an amorphous electrode film is also disclosed.

26 Claims, 13 Drawing Sheets

(56) References Cited

U.S. PATENT DOCUMENTS

| | | | |
|---|---|---|---|
| 7,238,262 B1 * | 7/2007 | Bartolomei et al. | 204/192.26 |
| 2002/0109458 A1 | 8/2002 | Pichler et al. | 313/504 |
| 2003/0168973 A1 | 9/2003 | Lee et al. | 313/506 |
| 2003/0218153 A1 | 11/2003 | Abe | |
| 2004/0086717 A1 | 5/2004 | Sasaki et al. | 428/411.1 |
| 2004/0140198 A1 | 7/2004 | Cho et al. | 204/192.29 |
| 2004/0258920 A1 | 12/2004 | Bender | 428/411.1 |

OTHER PUBLICATIONS

A. Suzuki et al.; "Highly conducting transparent indium tin oxide films prepared by pulsed laser deposition"; 2002 Elsevier Science B.V.; Thin Solid Films 411(2002) 23-27.

Y. Suzuki et al.; Low-resistivity ITO films by dc arc discharge ion plating for high duty LCDs; 1997 Elsevier Science B.V.; Journal of Non-Crystalline Solids 218 (1997) 30-34.

* cited by examiner ature ($T_g$) below 150° C. Also, the coefficient of thermal expansion (CTE) of plastics (typically 60~100 ppm/° C.) is much higher than that of ITO (<20 ppm/° C.). A high
OPTOELECTRONIC DEVICES HAVING ELECTRODE FILMS AND METHODS AND SYSTEM FOR MANUFACTURING THE SAME

STATEMENT REGARDING FEDERALLY SPONSORED RESEARCH AND DEVELOPMENT

The United States Government may have certain rights in this invention pursuant to U.S. Government Sub-Contract Number RFP04-106 with U.S. Display Consortium under Prime Contract Number MDA972-93-2-0014 with U.S. Army Research Lab.

BACKGROUND

The invention relates generally to electrode films. The invention relates particularly to electrode films for optoelectronic devices.

Organic optoelectronic devices include organic light emitting devices, organic photovoltaic devices, organic electrochromic devices, and the like. Organic optoelectronic devices operate by injection of charges, which recombine to result in radiation of energy as in a light emitting device, or by separation of charges as in a photovoltaic device. Many organic optoelectronic devices, such as organic light emitting devices (OLEDs), may require transparent electrodes. For example, when OLEDs serve as display or lighting devices, it is necessary for the generated light to leave the device. Therefore, at least one of the two electrodes is fabricated out of, transparent conducting material, such as tin doped indium oxide (ITO). Thin ITO films have been widely used as transparent electrodes due to their high transparency, desirably 80% or greater transmittance in the wavelength region from about 400 nm to about 700 nm and low bulk resistivity, desirably $1\times10^{-3}$ ohm-cm or lower.

Conventionally, organic optoelectronic devices have been built on glass substrates. For glass substrates, electrode films such as ITO films, with low resistivity, have been easily achieved at substrate temperatures ($T_s$) higher than 200° C., using a variety of deposition techniques such as sputtering, electron-beam evaporation, and pulsed laser deposition. The use of plastic substrates for organic optoelectronic devices will help reduce the weight, the fragility of these devices, and make it possible to fabricate flexible devices. Plastics, particularly transparent plastics, normally have a glass transition temperature ($T_g$) below 150° C. Also, the coefficient of thermal expansion (CTE) of plastics (typically 60~100 ppm/° C.) is much higher than that of ITO (<20 ppm/° C.). A high temperature process may disadvantageously result in huge residual stress at the interface between the electrode material and the plastic substrate and cause the ITO layer to crack. Therefore, for plastic substrates, it may be advantageous to deposit the electrode material such as ITO, at a lower $T_s$ due to the heat-sensitivity of plastics. However, by implementing conventional deposition techniques performed at low $T_s$, it is difficult to achieve ITO films with low resistivity and high transparency.

Accordingly, a technique is needed to address one or more of the foregoing problems in optoelectronic devices, such as organic optoelectronic devices.

BRIEF DESCRIPTION

Briefly, in accordance with aspects of the present technique, a method of making an electrode film is presented. The method includes providing a target, moving a substrate relative to the target, positioning a shield to block a spatial region of sputtered target material from depositing on the substrate, wherein the spatial region corresponds to a region of plasma formed during DC magnetron sputtering, and a DC magnetron sputtering target to deposit an electrode film on the substrate.

In accordance with further aspects of the present technique, a deposition system for deposition of amorphous electrode films on plastic substrates is presented. The deposition system includes a vacuum chamber, a DC magnetron sputter target, a substrate holder to hold a substrate, wherein the substrate holder is capable of rotating about a rotation center, and a shield to block a spatial region of sputtered target material from depositing on the substrate, wherein the spatial region corresponds to a region of plasma formed during DC magnetron sputtering, wherein the shield is held stationary relative to the target, wherein the DC magnetron sputter target, the substrate holder and the shield are disposed within the vacuum chamber.

In accordance with further aspects of the present technique, a high uniformity, high transparency, low resistivity, amorphous film is presented. The film includes indium tin oxide, tin oxide, indium oxide, zinc oxide, aluminum oxide, gallium oxide, cadmium oxide, or indium zinc oxide, or any combination thereof, wherein the amorphous film has a bulk resistivity less than about $1\times10^{-3}$ ohm-cm, wherein the amorphous film has a transmittance greater than about 80% in a wavelength region from about 400 nm to about 700 nm, and wherein the amorphous film has a thickness variation less than about 10% of the average thickness of the amorphous film.

In accordance with further aspects of the present technique, an article including an amorphous electrode film is presented. The article includes a plastic substrate and a high uniformity, high transparency, high flexibility, low resistivity amorphous film deposited on the plastic substrate, wherein the amorphous film includes indium tin oxide, tin oxide, indium oxide, zinc oxide, or indium zinc oxide, aluminum oxide, gallium oxide, cadmium oxide, or any combination thereof.

According to still further aspects of the present technique, an optoelectronic device is presented. The device includes a plastic substrate, an amorphous electrode film deposited on the plastic substrate, an optoelectronic layer, and an amorphous electrode film deposited on the optoelectronic layer, wherein the amorphous electrode film having a bulk resistivity less than $1\times10^{-3}$ ohm-cm and a transmittance greater than 80% in the wavelength region from about 400 nm to 700 nm.

DRAWINGS

These and other features, aspects, and advantages of the present invention will become better understood when the following detailed description is read with reference to the accompanying drawings in which like characters represent like parts throughout the drawings, wherein.

Figure 18:
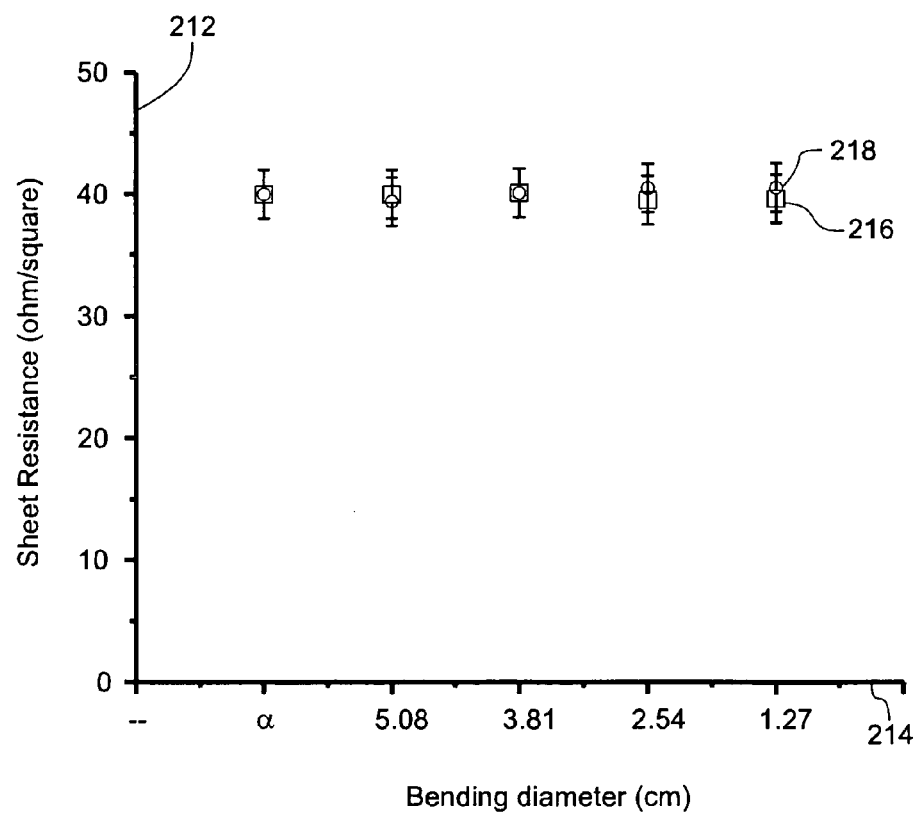
Figure 19:
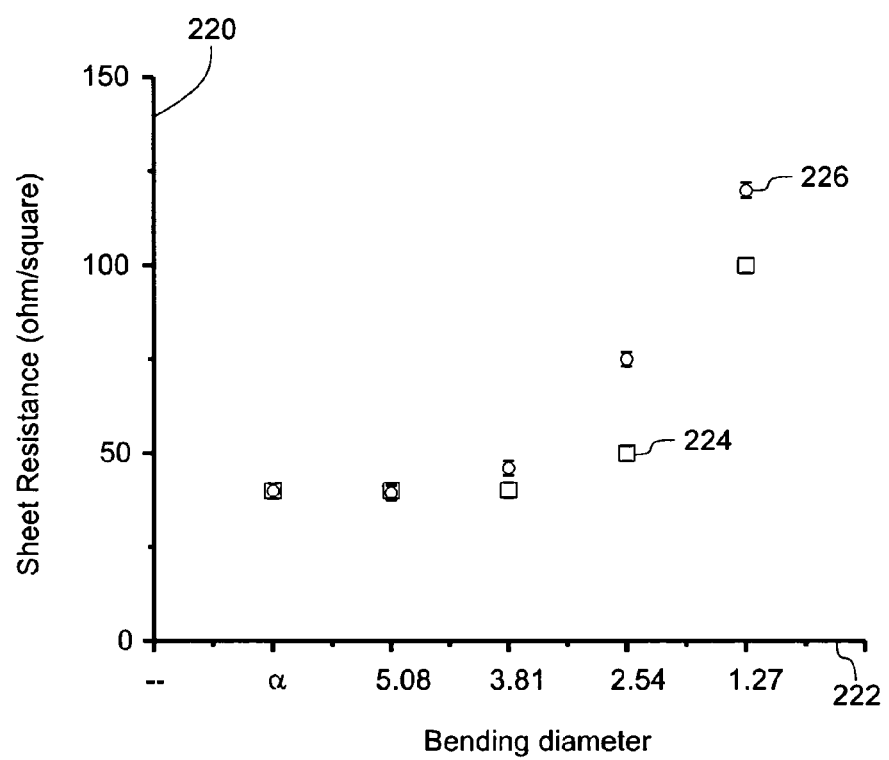

FIG. 18 is a graph illustrating variation in sheet resistance with bending diameter for an amorphous ITO film deposited using a shield subjected to tensile and compressive bending stress, according to aspects of the present technique; and FIG. 19 is a graph illustrating variation in sheet resistance with bending diameter for a polycrystalline ITO film deposited without using a shield subjected to tensile and compressive stress, according to aspects of the present technique.

DETAILED DESCRIPTION

Embodiments of the present invention disclose high flexibility, low resistivity electrode films, methods and deposition system for making such electrode films, and optoelectronic devices including such electrode films.

In the following specification and the claims that follow, reference will be made to a number of terms which shall be defined to have the following meanings. The singular forms "a", "an" and "the" include plural referents unless the context clearly dictates otherwise. The term "optoelectronic" as used herein refers to an material that is (1) capable of transporting, blocking or storing charge (either positive charge or negative charge), (2) light-absorbing or light emitting, typically although not necessarily fluorescent, and/or (3) useful in photo-induced charge generation, and/or 4) of changing color, reflectivity, transmittance upon application of bias. An "organic optoelectronic device" is a device comprising an organic optoelectronic material. In the present context an optoelectronic layer is a layer for an optoelectronic device, which comprises at least one optoelectronic material or at least one electrode material. As used herein the term "organic material" may refer to either small molecular organic compounds, or large molecular organic compounds, including but not limited to dendrimers, or large molecular polymers, including oligomers with a number of repeat unit ranging from 2 to 10, and polymers with a number of repeat unit greater than 10.

Prior art deposition techniques have focused on depositing polycrystalline ITO films on glass substrates, which generally employ a high temperature process (greater than 200 degree C.) either during deposition or in post-deposition treatment. Currently known polycrystalline ITO deposition techniques result in ITO films with lower resistivity and higher transparency, compared to amorphous ITO films deposited using currently known deposition techniques. Polycrystalline structures are more ordered structures than amorphous structures, the scattering to free electrons is greatly reduced, which leads to improved mobility. Also, a high temperature process can effectively increase the point defect density in ITO film and generate more oxygen vacancies or substitution, which in turn brings more free carriers into the ITO film. Thus, the higher mobility and larger carrier concentration of polycrystalline ITO film tends to make it more conductive than amorphous ITO film.

Figure 1:
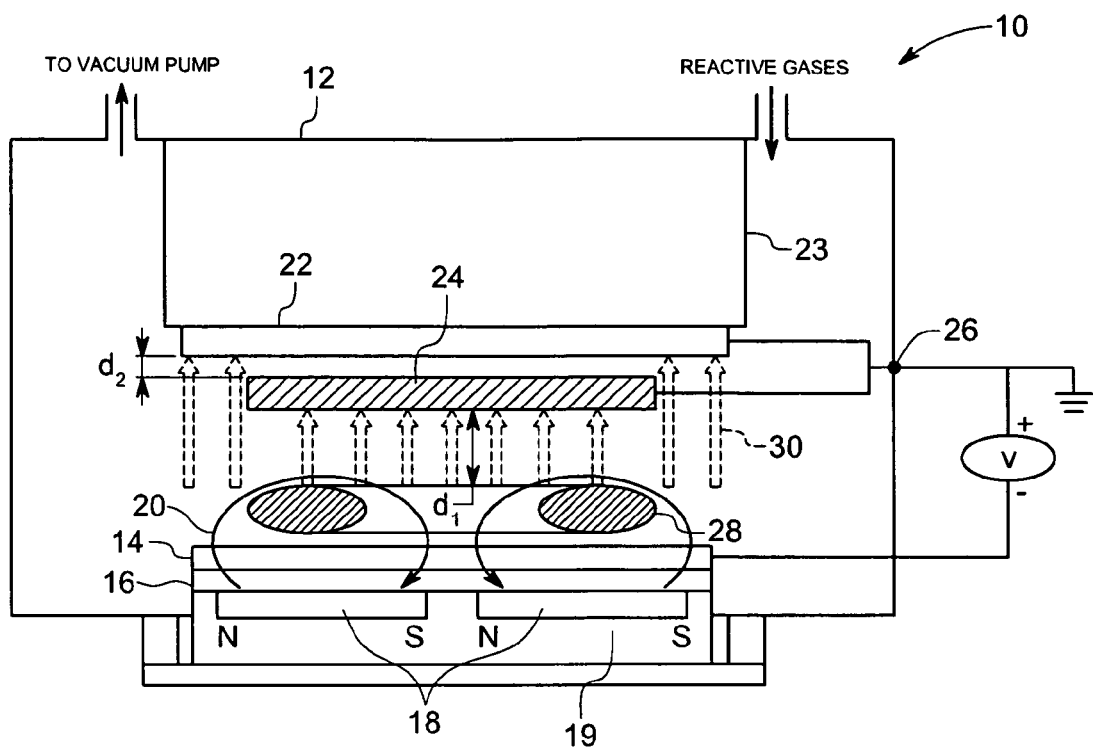
FIG. 1 is a cross-sectional representation of an exemplary embodiment of a DC magnetron deposition system for depositing an electrode film, according to aspects of the present technique.

In accordance with one embodiment of the present invention there is provided a DC magnetron sputtering deposition system 10 for depositing electrode films on plastic substrates as shown in FIG. 1. In a sputtering deposition system, ions are generated and directed at a target. The ions sputter material from the target, which also results in emission of secondary electrons. The sputtered material gets transported to a substrate through a region of reduced pressure and the sputtered material condenses on the substrate, forming a film. In a DC magnetron sputtering deposition system, a magnet is used to trap emitted secondary electrons in cycloids and circulate over the target's surface to increase the rate of ionization by the secondary electrons. In one embodiment of the present invention, the deposition system includes a vacuum chamber 12 with a target 14 placed inside the vacuum chamber. The target 14 mounted on a target mounting plate 16 is connected to a DC power supply and serves as a cathode. The DC magnetron sputtering deposition system includes magnet or magnets to generate a desired magnetic field. In one embodiment, the deposition system 10 includes a ring magnet 18 placed behind the target 14, which generates a static magnetic field 20 in front of the cathode 14. A cooling core 19 may be present to cool the heated target cathode. The magnetic field lines 20 are located parallel to the target cathode 14 surface. To mount a substrate 22 to be deposited upon, the deposition system may further include a substrate holder 23. In some embodiments of the present invention, the substrate holder 23 can hold a plurality of substrates for deposition. In a further embodiment, the substrate holder can be rotated about a rotation center during deposition. A shield 24 is mounted between the target 14 and the substrate 22. The substrate 22, substrate holder 23, shield 24 and the chamber 26 wall are all grounded and serve as the anode. In some embodiments, the shield may be embedded into the target. In certain embodiments, a shield embedded into the target with a deposit or coating of the sputter material blocked by it, may itself serve as target for subsequent depositions. The target may be chosen to have different geometries such as, but not limited to, planar, non-planar, and circular geometries.

During DC magnetron sputtering, reactive gases (mixture of Ar and $O_2$) are introduced into chamber 12 and ionized by DC voltage between the cathode and anode. Since ions formed in this process, such $Ar^+$, $O^+$, and $O^{++}$ are positively charged, they are attracted by the cathode and bombard the target 14 surface. Secondary electrons that are emitted from the cathode 14 due to ion bombardment are constrained by this magnetic field to move in a direction perpendicular to both the electric field (normal to the target surface) and the magnetic field. This drift causes electrons to move parallel to the surface of the cathode 14 in a direction 90 degrees away from the magnetic field. Under certain magnetic field conditions, drifting secondary electrons form a current loop. These drifting secondary electrons are essentially trapped in a region close to the cathode. Eventually they lose their kinetic energy due to collisions with gas atoms (ionization) or with other electrons (electron heating), and result is extremely dense plasma (plasma 28) in this region. Ions created in this region have a high probability of hitting the target cathode. This results in the sputtering of the target material and also leads to the emission of secondary electrons. Therefore, even more secondary electrons are produced and eventually extremely dense plasma forms. As shown in FIG. 1, the sputtered material emerging from the target in the area of the plasma is blocked by the shield 24 from reaching the target, whereas the sputter material emerging from outside the shield region 30 can be expected to reach the substrate. In one embodiment, the shield is held stationary relative to the target. In some embodiments of the present invention, the deposition system 10 is used to deposit amorphous films.

Figure 2:
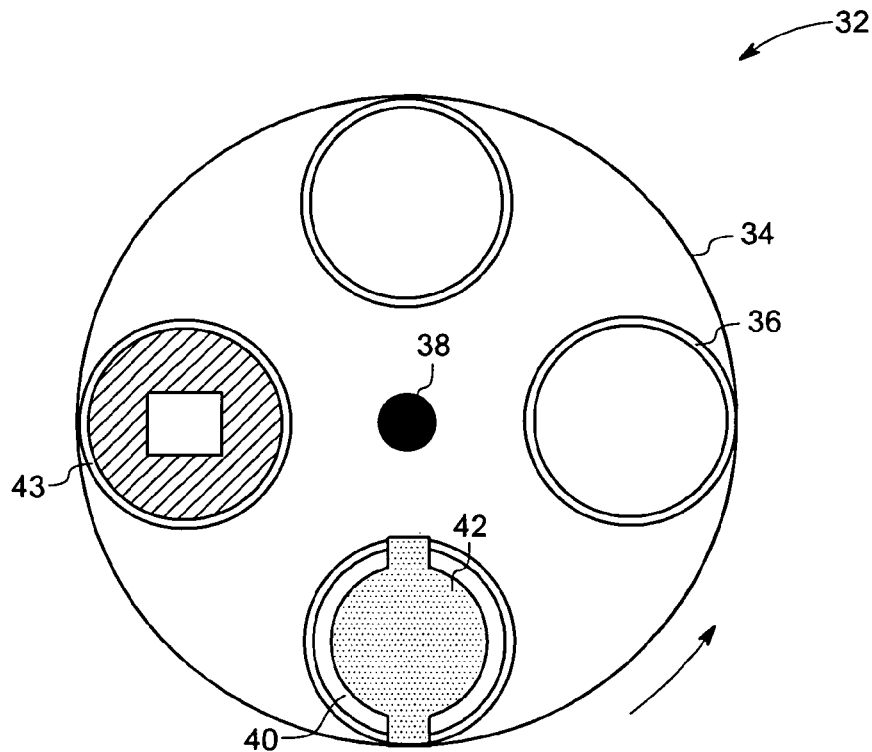
FIG. 2 is a top view representation of an exemplary embodiment of a substrate holder, according to aspects of the present technique.
Figure 3:
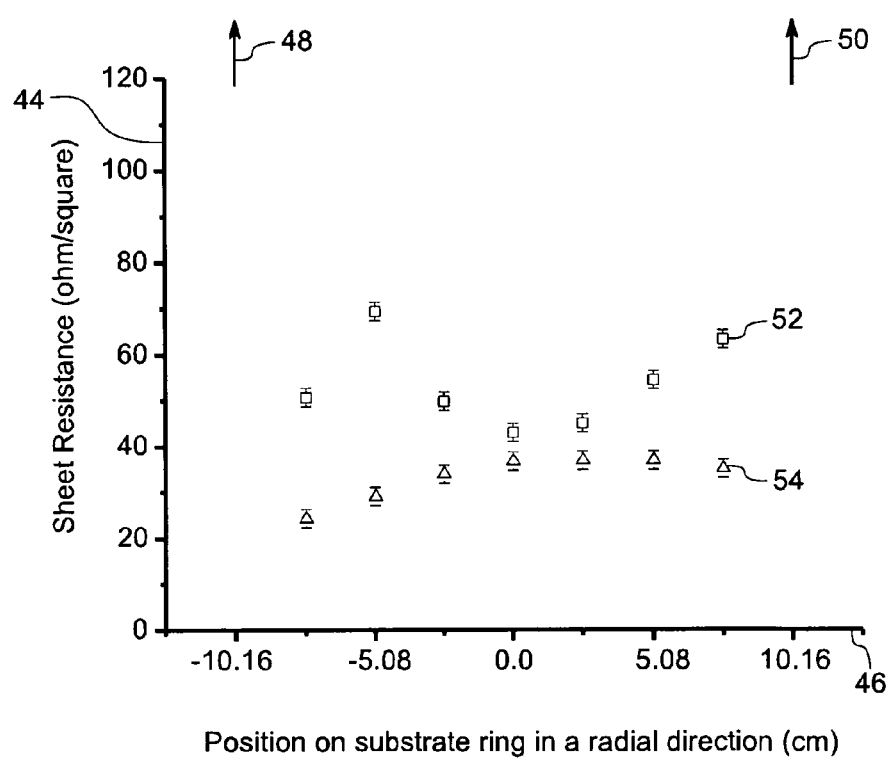
FIG. 3 is a graph illustrating variation in sheet resistance with position on a substrate ring for ITO films deposited with and without a shield, according to aspects of the present technique.

In some embodiments, as discussed above, the deposition system includes a substrate holder, which can hold a plurality of substrates for deposition. In the illustrated embodiment shown in FIG. 2, the substrate holder 32 includes a base 34, and four substrate rings 36 for holding the substrates. The substrate holder 32 can be rotated about a rotation center 38, during deposition. As the substrate holder 32 is rotated at a uniform speed, the four substrates 40 move in succession across the area of target (not shown), plasma (not shown) and shield 42. This enables uniform deposition of the electrode material on the substrate. In a further embodiment, the deposition system includes a shadow mask 43 placed in the proximity of the substrate to enable deposition of sputtered target material. The shadow mask may be used to pattern or preferentially deposit material over the substrate. The shadow mask may have any geometry. In a non-limiting example, the shadow mask 43 can be a metal plate with a square opening as shown in FIG. 3. The target material may be selectively deposited onto the substrate using the shadow mask to replicate such a square pattern. In one embodiment, the shadow mask is held stationary with respect to the substrate. In a further embodiment the shadow mask is attached to the substrate holder. Suitable materials for use in shadow masks include, but are not limited to, metal, glass, plastic, and paper.

In accordance with another embodiment of the present invention, there is provided a method for depositing electrode films on plastic substrates. In one embodiment, the method is a low temperature method. As used herein, the term "low temperature" refers to a temperature lower than 200 degree C. In some embodiments, the deposited films exhibit high uniformity. As used herein, the term "high uniformity" refers to a thickness variation of less than 10% of the average thickness of the film. In certain embodiments the deposited films exhibit high transparency. As used herein, the term "high transparency" refers to a transmittance level of 80% or greater for wavelengths in the 400 nm to 700 nm region of the visible spectrum. In further embodiments, the deposited films exhibit low resistivity. As used herein, the term "low resistivity" refers to a bulk resistivity value of $1\times10^{-3}$ ohm-cm or lower.

The method includes using a DC magnetron sputtering technique with a desirably configured shield. The shape and structure of the shield may be selected depending on the shape of the plasma formed during DC magnetron sputtering. In one embodiment, the shield blocks a spatial region of sputtered target material corresponding to greater than 20% of the plasma area. In a further embodiment, the shield blocks a spatial region of sputtered target material corresponding to greater than 50% of the plasma area. In a still further embodiment, the shield blocks a spatial region of sputtered target material corresponding to greater than 80% of the plasma area.

The method includes providing a substrate, moving a substrate relative to the target, positioning a shield to block a spatial region of sputtered target material from depositing on the substrate, wherein the spatial region corresponds to a region of plasma formed during DC magnetron sputtering. In one embodiment, moving a substrate relative to the target corresponds to rotating the substrate about a rotation center and moving it across the target. The method further includes DC magnetron sputtering a target to deposit an electrode film on the substrate. In one embodiment, positioning a shield includes providing a shield with a predetermined geometry, and positioning the shadow in a predetermined position, wherein the shield is between the plasma and the substrate. In one embodiment, the plasma generated has a closed loop or race-track shape. In certain embodiments the plasma forms a ring shaped plasma. In one embodiment the shield comprises a disc shaped structure. In another embodiment, the shield comprises a ring like disc structure with an aperture. The shield can be made from various materials such as metals or ceramic, or any combination thereof. In one embodiment, the shield may be designed to be embedded into target.

As the shield blocks the sputtered material, it receives a coating or deposit of the target material. In one embodiment, the target includes a shield with a deposit of blocked sputtered target material. This will help increase the utilization rate of sputtering target, which is normally expensive.

In one embodiment, the electrode film may be deposited on a substrate such as a plastic substrate. In another embodiment, the electrode may be deposited on a substrate such as an optoelectronic device structure. For example, an organic light emitting device structure may include a light emitting polymer layer deposited over a metal cathode layer. An anode film, such as an ITO film, may be deposited over the light emitting polymer layer. Embodiments of the present invention provide a method for depositing such electrode films without damaging a substrate or device layer they are deposited on.

Non-limiting examples of target materials include indium tin oxide, tin oxide, indium oxide, zinc oxide, cadmium oxide, aluminum oxide, gallium oxide, indium zinc oxide, tungsten oxide, molybdenum oxide, titanium oxide, vanadium oxide and combinations thereof. Further examples of target materials include aluminum, platinum, gold, silver, lanthanide series metals such as but not limited to cerium, europium, and alloys thereof and combinations thereof. In some embodiments metals and metal alloys may be sputter deposited on films as dopants.

An ITO film was deposited using the following conditions: 0.7 mTorr deposition pressure, with a gas mixture of 22% oxygen and 78% Ar, with a DC sputtering power of 2.9 W/cm$^2$, using a shield and a rotating substrate relative to the target. Another ITO film was deposited under similar conditions, without a shield, while holding the target stationary with respect to the substrate FIG. 3 is a graph illustrating variation in sheet resistance (44) with position (46) on a substrate ring for the ITO films deposited with and without a shield, according to aspects of the present technique. In FIG. 3, arrow marks 48 and 50, mark the rotation center and the chamber wall respectively. Scatter plot 52 illustrates the variation in sheet resistance (44) with position (46) for an ITO film deposited without shield, with all other deposition parameters optimized. The plot 52 shows a higher average sheet resistance and greater variation than scatter plot 54 for an ITO film deposited with a shield, with all other deposition parameters optimized. It is evident that the method of the present invention provides electrode films with lower sheet resistance and increased uniformity.

Figure 4:
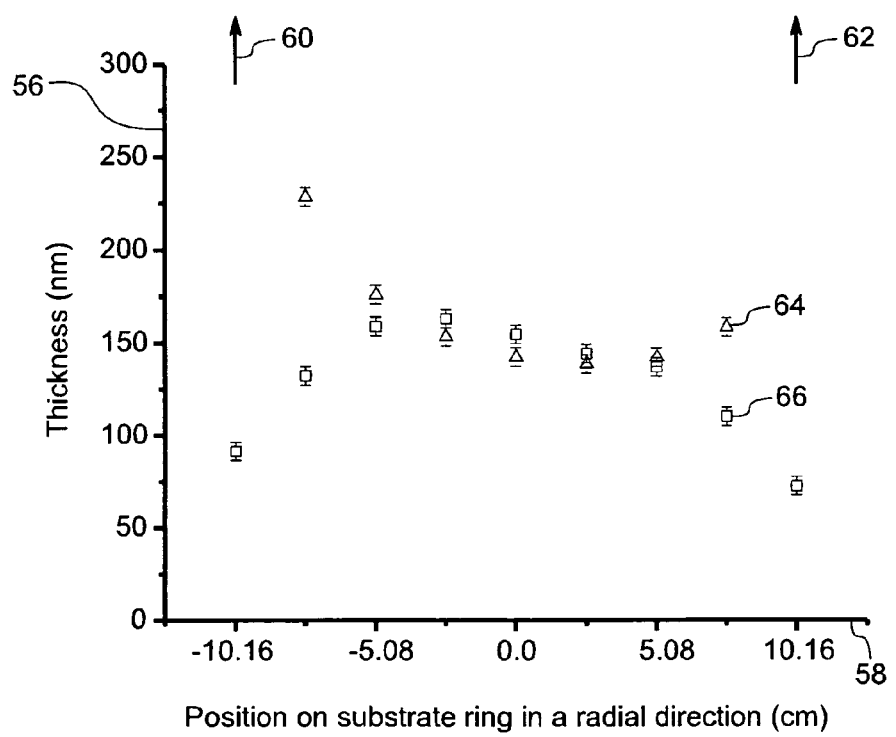
FIG. 4 is a graph illustrating variation in thickness with position on a substrate ring for ITO films deposited with and without a shield, according to aspects of the present technique.

FIG. 4 is a graph illustrating variation in thickness (56) with position (58) on a substrate ring for the ITO films deposited with and without a shield, according to aspects of the present technique. Arrow marks 60 and 62 mark the rotation center and the chamber wall respectively, in relation to the substrate ring Scatter plots 64 and 66 illustrate the variation in thickness (56) with position (58) for ITO films deposited without and with a shield, with all other deposition parameters optimized. Comparison of plots 64 and 66 shows that under similarly optimized conditions, on average, thinner films can be deposited when a shield is used. Although the applicants do not wish to be bound by any particular theory, the thickness distribution of sputtered films deposited without a shield, is governed by several factors including the angular distribution of sputtered particles, collisions between sputtered particles and gas molecules in the deposition chamber, and the construction of the target. Calculations performed by the applicants show that thickness distribution for a deposited film is not uniform. Instead, the distribution shows maximum thickness for substrate regions directly facing the plasma, with the thickness decreasing both towards the center of the plasma and towards the edges of the plasma. Although the applicants do not wish to be bound by any particular theory, it is believed that the sputtered material generated in the region of the plasma have higher sputter rate than the sputtered material outside of the plasma region, thus lead to formation of thicker films. Although the applicants do not wish to be bound by any particular theory, it is believed that the sputtered material generated in the region of the plasma on average have higher energy than outside the plasma area. Such sputtered material because of their higher energy may cause damage to softer substrates such as plastic compared to glass.

Figure 5:
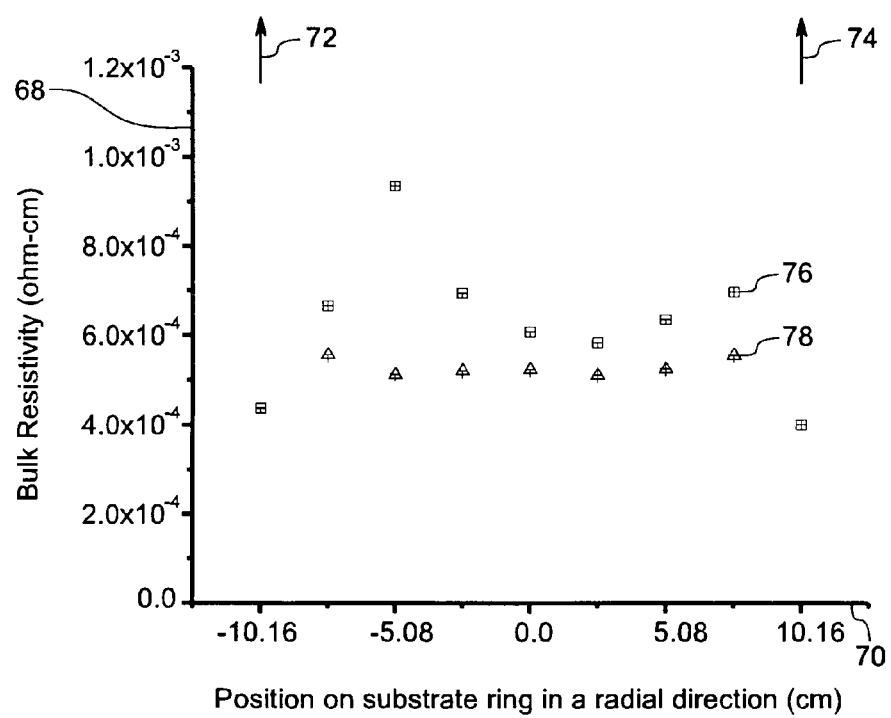
FIG. 5 is a graph illustrating variation in bulk resistivity with position on a substrate ring for ITO films deposited with and without a shield, according to aspects of the present technique.

FIG. 5 is a graph illustrating variation in bulk resistivity (68) with position (70) on a substrate ring for the ITO films deposited with and without a shield, according to aspects of the present technique. Bulk resistivity is given by the product of sheet resistance in ohms and thickness in cm. Arrow marks 72 and 74 mark the rotation center and the chamber wall respectively in relation to the substrate holder ring holding the substrate. Scatter plots 76 and 78 illustrate the variation in bulk resistivity with position for deposition without and with a shield. Comparison of scatter plots 76 and 78 show that while the bulk resistivity corresponding to plot 78 shows lower average bulk resistivity and greater uniformity. Further, plot 76 shows two peaks in the scatter plot corresponding to higher density regions in the plasma. Again in plot 76, for positions on the ITO film closer to edges of the substrate, the bulk resistivity is lower. Therefore, as stated above, upon blocking the higher density plasma region in the plasma, electrode films with lower and more uniform bulk resistivity can be deposited.

The existence of dense plasma not only affects the thickness distribution of ITO coating on the ring, but also affects the bulk material properties of ITO coating. Highly energetic electrons irradiate the substrates and/or the growing surface of the thin films during deposition. The bombardment of high-energy neutral oxygen atoms on the growing surface of ITO could reduce oxygen vacancy density, which in turn reduce carrier density and increase bulk resistivity. The effects of the bombardment are obvious at the position facing the plasma area, as shown in FIG. 5. Furthermore, the highly energetic species bombardment can also change the crystal phase of ITO coating. X-ray diffraction (XRD) analysis carried out by the applicants to study the crystallinity of ITO coating samples from position "−10.16 cm" (edge area) and position "−5.08" (facing plasma area) on ring, show that ITO coating from positions about "−10.16" was amorphous while ITO coating from positions about "−5.08" was polycrystalline. This suggests that the bombardment of highly energetic species at position "−5.08" gives ITO coating extra energy to crystallize. Thus, ITO coatings with different bulk properties were achieved on the substrate ring, when deposition was carried out without a shield and without rotation of the substrate.

Figure 6:
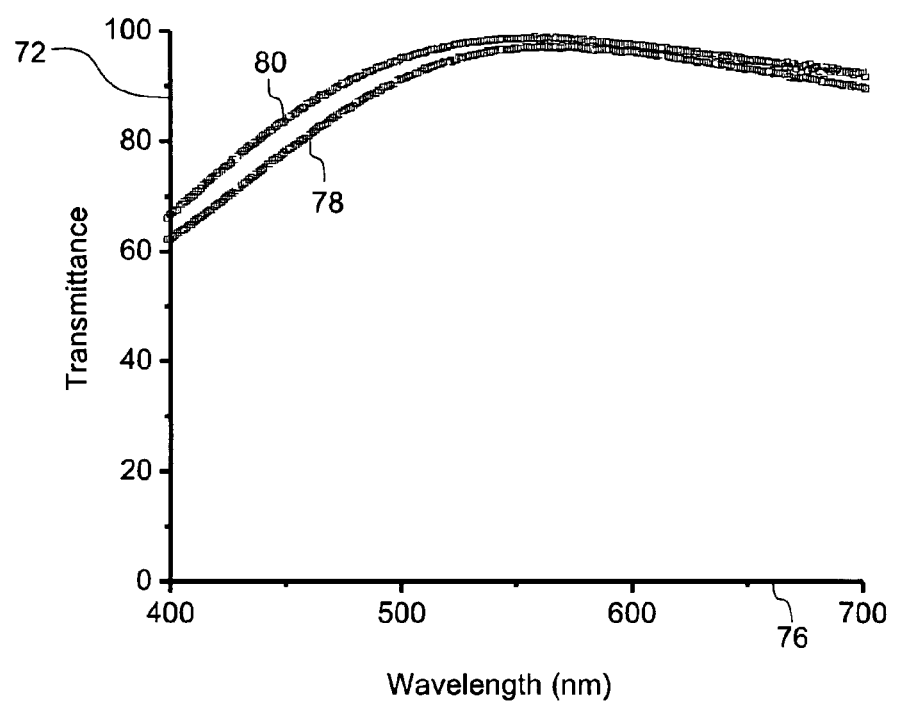
FIG. 6 is a graph illustrating variation in transmittance with wavelength of incident light for ITO films deposited with and without a shield, according to aspects of the present technique.

FIG. 6 is a graph illustrating variation in transmittance (72) with wavelength (76) of incident light for ITO films deposited with and without a shield respectively, according to aspects of the present technique. Plots 78 and 80 illustrate the variation in transmittance over the wavelength region of 400 nanometers and 700 nanometers. It is evident on comparison of the plots that using a shield does not adversely affect the optical properties of the film. In fact, the average transmittance increases from 88.87% to 91.92%.

Figure 7:
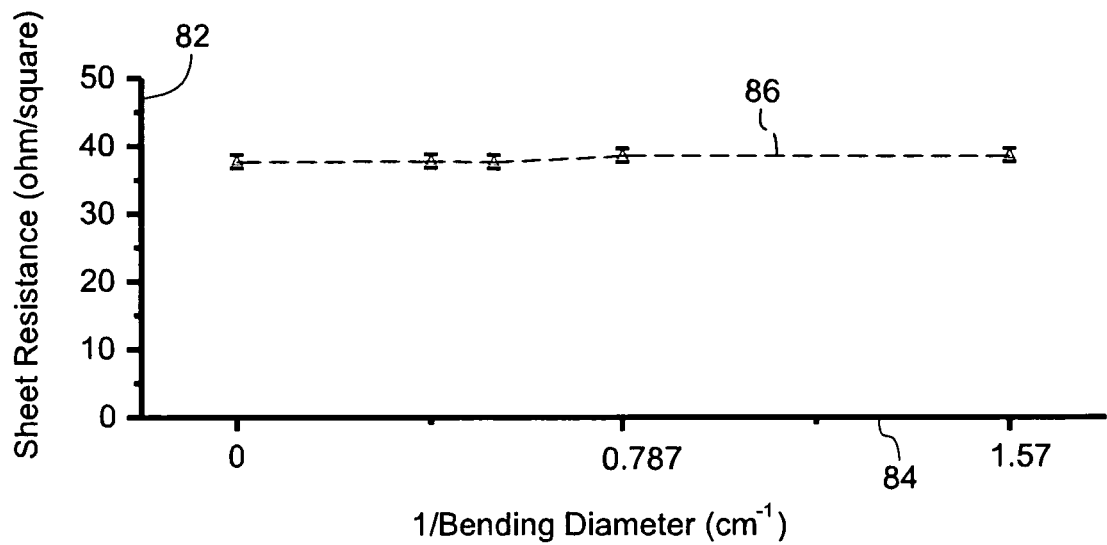
FIG. 7 is a graph illustrating variation in sheet resistance with inverse of bending diameter upon tensile bending, for ITO films deposited, according to aspects of the present technique.

In one embodiment of the present invention, amorphous electrode films including materials such as ITO, exhibit lesser stress and greater flexibility resulting in less cracks upon application of bending under compressive stress. As used herein, the term "high flexibility" refers to less than about 5% variation in sheet resistance upon application of tensile or compressive bending. FIG. 7 is a graph illustrating variation in sheet resistance with inverse of bending diameter for ITO films deposited on a plastic substrate with a shield, according to aspects of the present technique. The presence of any cracks can be expected to lead to an increase in sheet resistance. Scatter plot 86 of the variation in sheet resistance (82) with the inverse of bending diameter (84) for an ITO film deposited with the shield subjected to a compressive bending stress deposited without shield, clearly shows that the deposited ITO film is highly flexible and less susceptible to compressive bending stress as no significant change in sheet resistance is seen.

Figure 8:
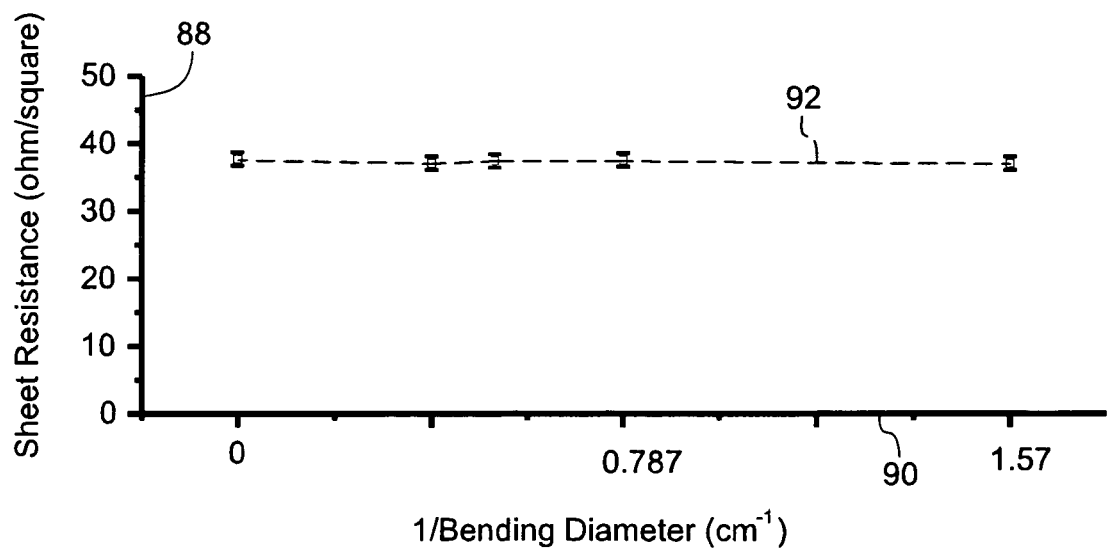
FIG. 8 is a graph illustrating variation in sheet resistance with inverse of bending diameter upon compressive bending for ITO films deposited, according to aspects of the present technique.

FIG. 8 is a graph illustrating variation in sheet resistance (88) with inverse of bending diameter (90) for ITO films deposited with a shield subjected to a tensile stress, according to aspects of the present technique. Scatter plot 92 clearly shows that the deposited ITO film is highly flexible and is not highly susceptible to tensile bending stress, as no significant change in sheet resistance is seen.

Another embodiment of the present invention is an amorphous transparent electrode film for optoelectronic devices with plastic substrates. The films exhibit high uniformity, high transparency and low resistivity. The amorphous film includes materials such as indium tin oxide, tin oxide, indium oxide, zinc oxide, zinc aluminum oxide, zinc gallium oxide, cadmium oxide, or indium zinc oxide, tungsten oxide, molybdenum oxide, titanium oxide, or vanadium oxide or any combination thereof.

In some embodiments the amorphous electrode film is a low resistance amorphous film having a bulk resistivity less than about $1\times10^{-3}$ ohm-cm. In some other embodiments the amorphous electrode film is a high transmittance amorphous film having a transmittance greater than about 80% in a wavelength region from about 400 nm to 700 nm. In some further embodiments the amorphous electrode film is a flexible amorphous film having a variation in sheet resistance upon tensile bending of less than about 5%, wherein a bending diameter is less than about 5 cm. In still further embodiments, the amorphous electrode film is a flexible amorphous film having a variation in sheet resistance upon compressive bending of less than about 5%, wherein a bending diameter is less than about 5 cm.

In a further embodiment of the present invention, is an optoelectronic device including an amorphous electrode film. The amorphous electrode film has a bulk resistivity less than about $1\times10^{-3}$ ohm-cm and a transmittance greater than about 80% in the wavelength region from about 400 nm to 700 nm. The optoelectronic device further includes a plastic substrate, an optoelectronic layer. In some embodiments, the optoelectronic device is an organic optoelectronic device. Such organic optoelectronic devices include but are not limited to organic light emitting devices, organic photovoltaic devices, and organic electrochromic devices.

In one embodiment, the method of the present invention has a high deposition rate for electrode films. In a non-limiting example, an ITO top contact, 110 nm thick, for an organic light emitting device was deposited at a rate of about 1.7 Å/sec for about 11 minutes. The film exhibited a sheet resistance of about 45 ohms/square and the device emitted light at 1.3 candela/Ampere.

Non limiting examples of substrates include thermoplastic polymer, poly(ethylene terephthalate), poly(ethylene naphthalate), polyethersulfone, polycarbonate, polyimide, acrylate, polyolefin, glass, metal, and like materials, and combinations thereof.

Organic optoelectronic devices of the present invention may include layers such as but not limited to, hole transport layers, hole injection layers, electron transport layers, electron injection layers, a photoabsorption layers, cathode layers, anode layer and electroluminescent layers.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

Example 1

By employing the shield, the ITO sputtering process was optimized again and the new deposition parameters were as follows:

Eight samples, sample A, sample B, sample C, sample D, sample E, sample F, sample G and sample H, each including a plastic substrate with an amorphous ITO layer film were fabricated. For each sample, a plastic substrate, Tg of 240 degree C., polycarbonate, was mounted on about a 20.32 cm ring substrate holder capable of rotating about an axis. An ITO target was used and the ITO sputtering was carried out with the following parameters: 0.7 mTorr of deposition pressure, 30 sccm of Ar, 8.5 sccm of $O_2$, 2.9 W/cm² for sputtering power density. To achieve uniform ITO coating, the substrate was constantly rotating during deposition, at a rotation speed of 4 sec/cycle for 14 minutes with deposition rate of 1.7 Å/sec.

Sheet resistance was measured using a 4-probe measurement system. ITO film thickness was measured with ellipsometry on silicon chips that were taped to polycarbonate substrate surface at various positions on ring over 20.32 cm diameter. The optical transmittance of ITO film was measured with UV-VIS spectrophotometry. The substrates were rotated during deposition, and the deposition along the tangential direction is expected to be uniform in tangent direction. Thus the non-uniformity, if any, can happen only in radial direction and therefore, the film sheet resistance and film thickness was measured on spots located from closest to the substrate holder rotation center to the edge of substrate holder.

Figure 9:
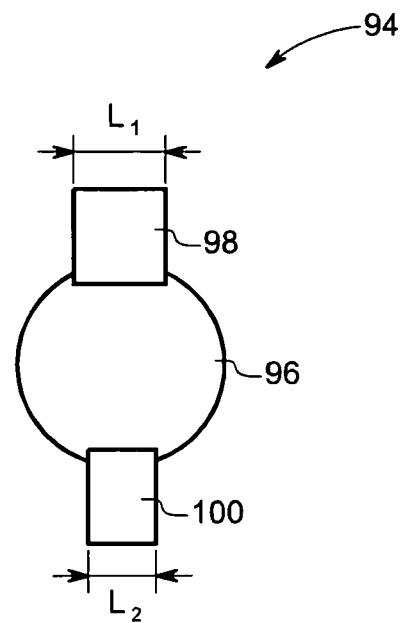
FIG. 9 is a top view representation of a first exemplary embodiment of a shield, according to aspects of the present technique.

Sample A was prepared using a shield 94 as shown in FIG. 9. The shield included a circular disc structure 96 and rectangular mounting structures 98 and 100 to effectively obscure higher density regions of the plasma from the target and selectively allow for the deposition of lower energy species from the target. In sample A, the diameter of the disc structure 96, was about 15.24 cm and $L_1$, $L_2$, the widths of mounting structures 98 and 100 were about 10.16 cm and about 5.08 cm, respectively. The film thickness was measured at several points.

Figure 10:
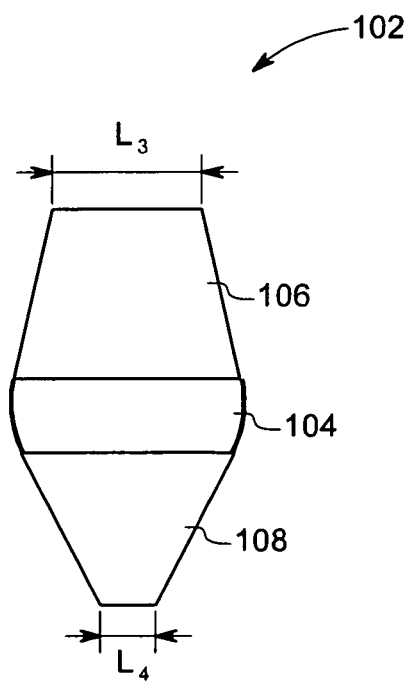
FIG. 10 is a top view representation of a second exemplary embodiment of a shield, according to aspects of the present technique.

Sample B was prepared using a shield 102 as shown in FIG. 10. The shield included a circular disc structure 104 and quadrilateral mounting structures 106 and 108 to effectively obscure higher density regions of the plasma from the target and selectively allow for the deposition of lower energy species from the target. In sample B, the diameter of the disc structure 104 was about 15.24 cm and $L_3$, $L_4$ the end widths of mounting structures 106 and 108 were 12.70 cm and about 5.08 cm, respectively. The film thickness was measured at several points.

Figure 11:
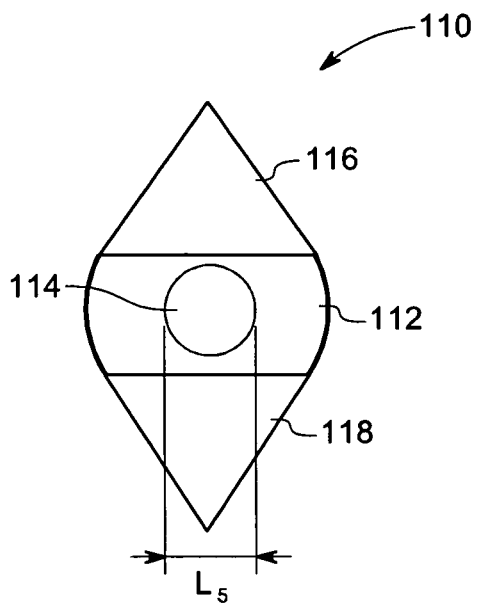
FIG. 11 is a top view representation of a third exemplary embodiment of a shield, according to aspects of the present technique.

Sample C was prepared using a shield 110 as shown in FIG. 11. The mask shield included a circular disc structure 112 with a circular aperture 114 and triangular mounting structures 116 and 118 to effectively obscure higher density regions of the plasma from the target and selectively allow for the deposition of low energy species from the target. In sample C, the diameter of the disc structure 112 was about 15.24 cm, and the diameter L5 of the aperture was about 5.08 cm. The film thickness was measured at several points.

Figure 12:
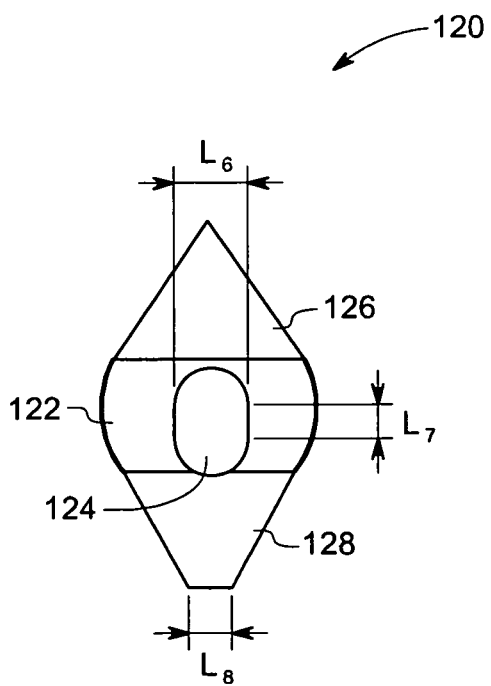
FIG. 12 is a top view representation of a fourth exemplary embodiment of a shield, according to aspects of the present technique.

Sample D was prepared using a shield 120 as shown in FIG. 12. The shield included a central structure 122 with an aperture 124 as shown in FIG. 12 and mounting structure 126 and 128 to effectively obscure higher density regions of the plasma from the target and selectively allow for the deposition of lower energy species from the target. In sample D, L6, the width of the semi circular section of the aperture, is about 5.08 cm, L7, the width of flat section of the aperture was about 1.27 cm, and L8, the end width of the mounting structure 128 was about 5.08 cm. The film thickness was measured at several points.

Figure 13:
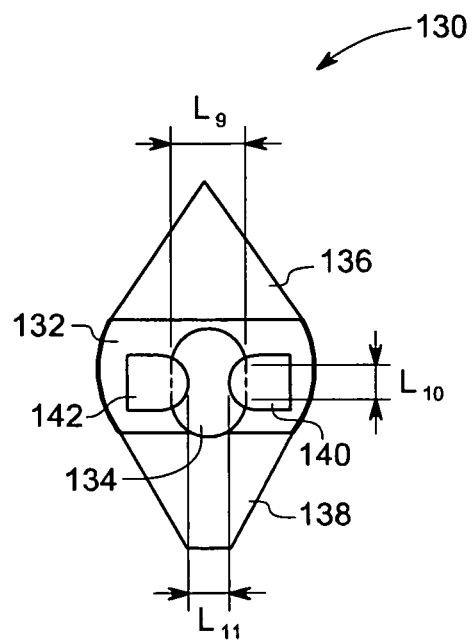
FIG. 13 is a top view representation of a fifth exemplary embodiment of a shield, according to aspects of the present technique.

Sample E was prepared using a shield 130 as shown in FIG. 13. The shield included a center structure 132 with an aperture 134 as shown in FIG. 13 and mounting structures 136 and 138 to effectively obscure the higher density regions of the plasma from the target and selectively allow for the deposition of lower energy species from the target. The aperture opening was further occluded by two aperture control structures 140 and 142. In some embodiments, the positions of these D-shaped structures may be adjustable. In this example, L9 was about 5.08 cm, and L10 was about 1.27 cm. The distance L11 between the aperture control structures was about 2.54 cm.

Figure 14:
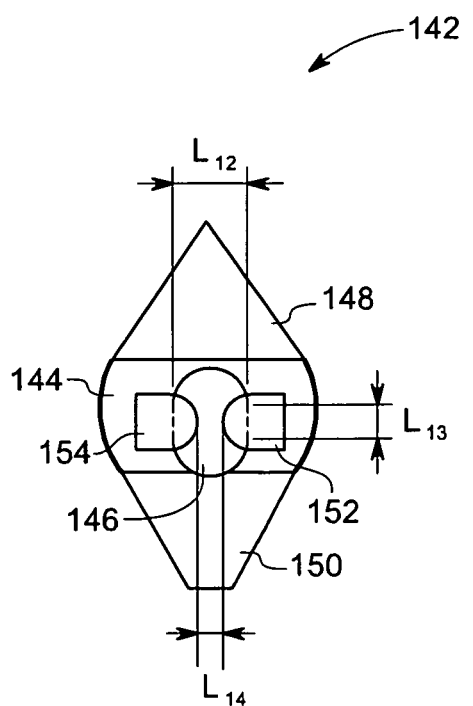
FIG. 14 is a top view representation of a sixth exemplary embodiment of a shield, according to aspects of the present technique.

Sample F was prepared using a shield 142 as shown in FIG. 14. The shield included a center structure 144 with an aperture 146 as shown in FIG. 14 and mounting structures 148 and 150 to effectively obscure higher density regions of the plasma from the target and selectively allow for the deposition of lower energy species from the target. The aperture opening is further occluded by two aperture control structures 152 and 154. In this example, $L_{12}$ was about 5.08 cm, and $L_{13}$ was about 1.27 cm. The distance $L_{14}$ between the aperture control structures was about 1.27 cm.

Figure 15:
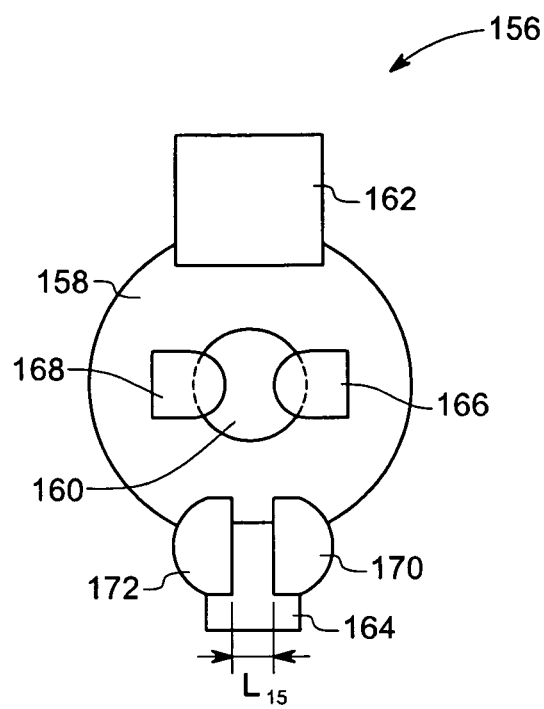
FIG. 15 is a top view representation of a seventh exemplary embodiment of a shield, according to aspects of the present technique.

Sample G was prepared using a shield 156 as shown in FIG. 15. The shield included a center structure 158 with an aperture 160 as shown in FIG. 15 and mounting structures 162 and 164 to effectively obscure the higher density regions of the plasma from the target and selectively allow for the deposition of lower energy species from the target. The aperture opening is further occluded by two aperture control structures 166, 168. In one embodiment, the aperture control structures are in shape of "D" as shown in FIG. 15. The shield further included a pair of side structures 170 and 172 overlapping the mounting structure 164. The film thickness was measured at several points. The width $L_{15}$ of the mounting structure 158 was 5.08 cm and the distance separating the side structures $L_{16}$ was 2.81 cm.

Figure 16:
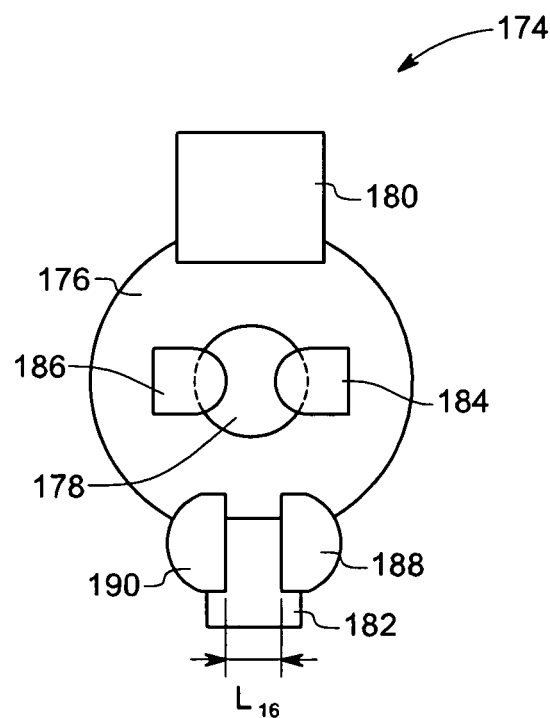
FIG. 16 is a top view representation of an eighth exemplary embodiment of a shield, according to aspects of the present technique.

Sample H was prepared using a shield 174 as shown in FIG. 16. The shield included a center structure 176 with an aperture 178 as shown in FIG. 16 and mounting structures 180 and 182 to effectively obscure higher density regions of the plasma from the target and selectively allow for the deposition of lower energy species from the target. The aperture opening is further occluded by two aperture control pieces 184 and 186. In some embodiments, the position of the aperture control pieces may be adjustable. The shield further included a pair of side structures 188 and 190 placed overlapping the mounting structure 182. The distance between $L_{16}$. The width $L_{17}$ of the mounting structure 158 was 5.08 cm and the distance separating the side structures $L_{18}$ was 2.81 cm. The film thickness was measured at several points.

Figure 17:
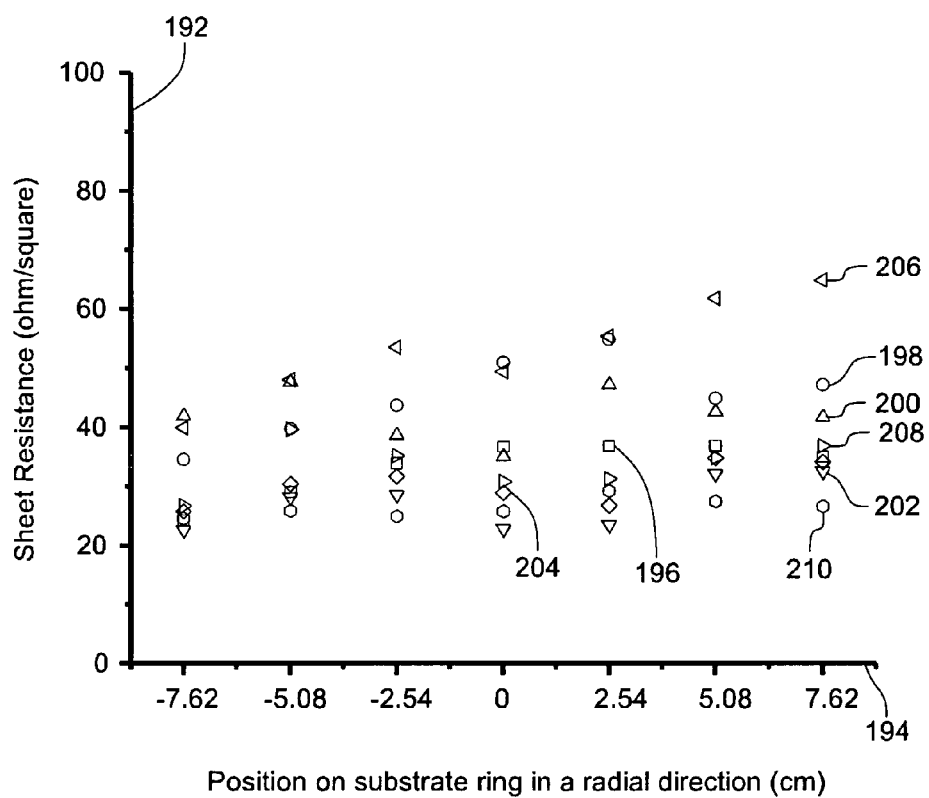
FIG. 17 is a graph illustrating variation in sheet resistance with position on a substrate ring for ITO films deposited with shields, according to aspects of the present technique.

FIG. 17 is a plot of the sheet resistance versus position on the deposited film from the respective substrate ring center for samples A through H. The scatter plot profiles 198, 200, 202, 204, 206, 208, and 210, illustrate the variation in sheet resistance with distance from the substrate ring center for samples A, B, C, D, E, F, G, and H respectively. It can be seen that sample H shows the least variation in sheet resistance through the length of the diameter of the substrate ring.

Example 2

Comparing FIGS. 18 and 19 clearly shows that an amorphous film of the present invention is more robust to compression and tensile forces and clearly more suitable for flexible plastic substrates. Plastic substrate samples were first measured for their as-received sheet resistance. One plastic substrate was coated under conditions identical to EXAMPLE 1 and a shield, identical to one used to prepare sample H in EXAMPLE 1 was used. A second sample was prepared without a shield. After the samples were bent around different diameters in compressive and tensile bending modes, sheet resistance measurements were performed over the bent area. FIGS. 18 and 19 illustrate the variation in sheet resistance with bending diameter for amorphous ITO film and polycrystalline ITO film. Provided that cracks formed in the ITO film, increase in sheet resistance should have been observed. However, the amorphous ITO film did not show any change in sheet resistance even for bending diameters of 1.27 cm. In comparison, the polycrystalline ITO film had much worse flexibility and started to develop cracks after bending around 3.81 cm bending diameter.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of making an electrode film, the method comprising:
   providing a target;
   moving a substrate relative to the target;
   positioning a shield to preferentially block a spatial region of sputtered target material from depositing on the substrate, wherein the spatial region corresponds to a higher density plasma region of plasma formed during DC magnetron sputtering, wherein the shield is held stationary relative to the target; and
   DC magnetron sputtering said target to deposit an electrode film on the substrate.

2. The method of claim 1, wherein positioning a shield comprises positioning a shield with a predetermined geometry in a predetermined position between the plasma and the substrate.

3. The method of claim 2, wherein the predetermined geometry comprises a disc.

4. The method of claim 2, wherein the predetermined geometry comprises a disc with an aperture.

5. The method of claim 1, wherein the shield comprises material comprising metals or ceramic, or any combination thereof.

6. The method of claim 1, wherein the shield is embedded into the target.

7. The method of claim 1, wherein the target comprises a shield with a deposit of sputtered target material blocked by the shield.

8. The method of claim 1, wherein the target comprises material comprising a metal or metal oxide or any combination thereof.

9. The method of claim 1, wherein the target comprises material comprising indium tin oxide, tin oxide, indium oxide, zinc oxide, cadmium oxide, alumimum oxide, gallium oxide, indium zinc oxide, tungsten oxide, molybdenum oxide, titanium oxide, or vanadium oxide or any combination thereof.

10. The method of claim 1, wherein the target comprises material comprising aluminum, platinum, gold, silver, or lanthanide series metals, or alloys thereof or any combination thereof.

11. The method of claim 1, wherein the method further comprising using a shadow mask to deposit in a pattern the sputtered target material onto the substrate.

12. The method of claim 1, wherein the electrode film comprises indium tin oxide, tin oxide, indium oxide, zinc oxide, aluminum oxide, gallium oxide, cadmium oxide, tungsten oxide, molybdenum oxide, titanium oxide, or vanadium oxide or indium zinc oxide, or any combination thereof.

13. The method of claim 1, further comprising rotating a substrate holder holding a target about a rotation center during sputtering.

14. The method of claim 1, wherein DC magnetron sputtering a target comprises sputtering at a temperature of less than about 200 degrees C.

15. A deposition system comprising:
a vacuum chamber;
a DC magnetron sputter target;
a substrate holder to hold a substrate, wherein the substrate holder is capable of rotating about a rotation center; and
a shield to preferentially block a spatial region of sputtered target material from depositing on the substrate, wherein the spatial region corresponds to a higher density plasma region of plasma formed during DC magnetron sputtering; wherein the shield is held stationary relative to the target
wherein the DC magnetron sputter target, the substrate holder and the shield are disposed within the vacuum chamber.

16. The deposition system of claim 15, wherein the shield comprises a circular disc.

17. The deposition system of claim 15, wherein the shield comprises a disc with an aperture.

18. The deposition system of claim 15, wherein the shield is at a positive voltage with respect to the target.

19. The deposition system of claim 15, wherein the shield is coupled to the chamber wall.

20. The deposition system of claim 15, wherein the deposition system further comprises a shadow mask, wherein the shadow mask is stationary relative to the target.

21. An article comprising:
a plastic substrate; and
a high uniformity, high transparency, high flexibility, low resistivity amorphous film deposited on the plastic substrate, wherein the amorphous film comprises material comprising indium tin oxide, tin oxide, indium oxide, zinc oxide, or indium zinc oxide, aluminum oxide, gallium oxide, cadmium oxide, or any combination thereof.

22. An optoelectronic device comprising:
a plastic substrate;
an amorphous electrode film deposited on the plastic substrate, wherein the amorphous electrode film has a bulk resistivity less than about $1 \times 10^{-3}$ ohm-cm, less than about 5% variation in sheet resistance upon application of tensile or compressive bending and a transmittance greater than about 80% in the wavelength region from about 400 nm to about 700 nm; and
an optoelectronic layer.

23. The optoelectronic device of claim 22, wherein the amorphous electrode film comprises material comprising indium tin oxide, tin oxide, indium oxide, zinc oxide, or indium zinc oxide, aluminum oxide, gallium oxide, cadmium oxide, or any combination thereof.

24. The optoelectronic device of claim 22, wherein the optoelectronic device is an organic optoelectronic device.

25. The optoelectronic device of claim 24, wherein the optoelectronic device is a light emitting device, a photovoltaic device, or an electrochromic device, or any combination thereof.

26. The optoelectronic device of claim 24, wherein the optoelectronic layer is a hole transport layer, a hole injection layer, an electron transport layer, an electron injection layers, a photoabsorption layers, a cathode layer, an anode layer or an electroluminescent layer or any combination thereof.

* * * * *

UNITED STATES PATENT AND TRADEMARK OFFICE
CERTIFICATE OF CORRECTION

| | | |
|---|---|---|
| PATENT NO. | : 8,845,866 B2 | Page 1 of 1 |
| APPLICATION NO. | : 11/316267 | |
| DATED | : September 30, 2014 | |
| INVENTOR(S) | : Yan et al. | |

It is certified that error appears in the above-identified patent and that said Letters Patent is hereby corrected as shown below:

In the Specification

In Column 10, Line 41, delete "mask shield" and insert -- shield --, therefor.

In the Claims

In Column 12, Line 49, in Claim 9, delete "alumimum" and insert -- aluminum --, therefor.

In Column 13, Line 14, in Claim 15, delete "target" and insert -- target, --, therefor.

Signed and Sealed this
Seventh Day of April, 2015

Michelle K. Lee
*Director of the United States Patent and Trademark Office*